(12) United States Patent
Li et al.

(10) Patent No.: US 12,707,566 B2
(45) Date of Patent: Aug. 11, 2026

(54) STACKABLE MEMORY MODULE WITH DOUBLE-SIDED COMPRESSION CONTACT PADS

(71) Applicant: Intel Corporation, Santa Clara, CA (US)

(72) Inventors: Xiang Li, Portland, OR (US); Konika Ganguly, Portland, OR (US); George Vergis, Portland, OR (US); Stephen Christianson, Tigard, OR (US); Xiaopeng Dong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 17/866,775

(22) Filed: Jul. 18, 2022

(65) Prior Publication Data

US 2022/0353991 A1 Nov. 3, 2022

(51) Int. Cl.
*H05K 1/11* (2006.01)
*H05K 1/14* (2006.01)
*H05K 1/181* (2026.01)

(52) U.S. Cl.
CPC ............. *H05K 1/117* (2013.01); *H05K 1/141* (2013.01); *H05K 1/181* (2013.01); *H05K 2201/10159* (2013.01); *H05K 2201/10189* (2013.01)

(58) Field of Classification Search
CPC ........ H05K 1/117; H05K 1/141; H05K 1/181; H05K 2201/10159
USPC .......................................................... 174/260
See application file for complete search history.

(56) References Cited

U.S. PATENT DOCUMENTS

2010/0110647 A1* 5/2010 Hiew ..................... H05K 1/117 361/752
2012/0262875 A1* 10/2012 Johnson ................... G11C 5/04 361/679.02
2021/0321516 A1* 10/2021 Rao ........................ H05K 1/111
2022/0029322 A1* 1/2022 Schnell ................ H01R 12/592

OTHER PUBLICATIONS

Mitchell, Robin, “Dell’s new memory technology, CAMM—What is it?” , Electropages, electronics product news for engineers & designers, https://www.electropages.com/blog/2022/04/dells-new-memory-technology-camm-what-it, 2022.
Extended European Search Report from European Patent Application No. 23172252.1 notified Dec. 14, 2023, 8 pgs.

* cited by examiner

*Primary Examiner* — Andargie M Aychillhum
(74) *Attorney, Agent, or Firm* — Essential Patents Group, LLP

(57) ABSTRACT

An example of an apparatus may comprise a first set of compression contact pads formed on a first side of a circuit board, a second set of compression contact pads formed on a second side of the circuit board opposite to the first side of the circuit board, where the first set of compression contact pads are respectively electrically connected to the second set of compression pads. An example of the circuit board may include a memory board. An example stackable memory module may include memory devices mounted to both sides of the memory board. Other examples are disclosed and claimed.

17 Claims, 12 Drawing Sheets

Provide a main board having first compression contact pads formed on a first side of the main board 61

Provide a first memory module having second and third electrically connected compression contact pads formed on two opposed sides of the first memory module 62

Compress a first compression mount connector between the main board and the first memory module to communicatively couple the first compression contact pads of the main board and the second and third compression contact pads of the first memory module 63

Configure the first memory module as a memory module of a one module per channel configuration 64

The one module per channel configuration may correspond to a 1DPC configuration 65

Provide a second memory module having fourth compression contact pads formed on a first side of the second memory module 66

Compress a second compression mount connector between the first memory module and the second memory module to communicatively couple the fourth compression contact pads of the second memory module and the second and third compression contact pads of the first memory module 67

The main board may include sixth compression contact pads formed on a second side of the main board opposed to the first side of the main board 68

Provide a second memory module having fourth compression contact pads formed on a first side of the second memory module 69

Compress a second compression mount connector between the main board and the second memory module to communicatively couple the fourth compression contact pads of the second memory module and the sixth compression contact pads of the main board 70

STACKABLE MEMORY MODULE WITH DOUBLE-SIDED COMPRESSION CONTACT PADS

BACKGROUND

Solderless compression mount technology (CMT) refers to contact technology to mount electrical/mechanical components, such as connectors, onto a printed circuit board (PCB). With CMT, an electrical contact is made by compressing two surfaces together without any solder between the components and the PCB. The PCB board includes single-sided contact pads that are designed to mate with the CMT component. For example, a CMT connector may include compressible contacts that are pressed onto the mating contact pads on the PCB board. The PCB and the CMT connector may also include matched holes for a fastener to mount the two parts together.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 6A to 6B are illustrative diagrams of another example of a method according to an example;

DETAILED DESCRIPTION

Figure 1:
FIG. 1 is a block diagram of an apparatus according to an example.
Figure 1:
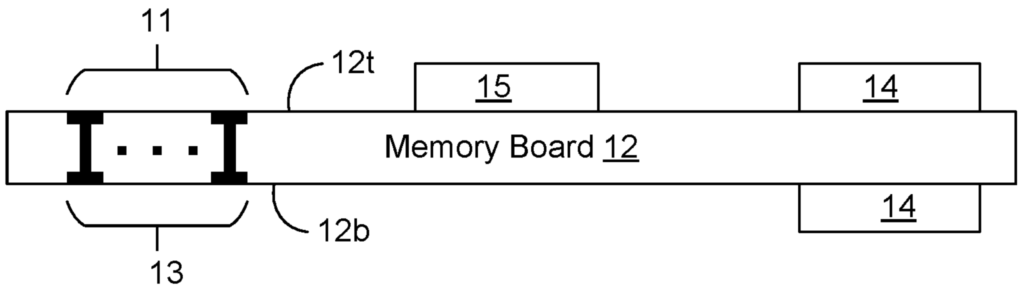

One or more examples or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; nonvolatile (NV) memory devices; qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every example may not necessarily include the particular feature, structure, or characteristic. Moreover, such phrases are not necessarily referring to the same implementation. Further, when a particular feature, structure, or characteristic is described in connection with an example, it is submitted that it is within the knowledge of one skilled in the art to effect such feature, structure, or characteristic in connection with other implementations whether or not explicitly described herein.

Various examples described herein may include a memory component and/or an interface to a memory component. Such memory components may include volatile and/or non-volatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular examples, DRAM of a memory component may comply with a standard promulgated by Joint Electron Device Engineering Council (JEDEC), such as JESD79F for double data rate (DDR) SDRAM, JESD79-

2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. Example memory devices may include NAND, memory, three-dimensional (3D) NAND memory, 3D crosspoint memory, etc. The memory device may refer to the die itself and/or to a packaged memory product. In particular examples, a memory component with non-volatile memory may comply with one or more standards promulgated by the JEDEC, or other suitable standard (the JEDEC standards cited herein are available at jedec.org).

A conventional form factor for a memory device includes a dual-inline memory module (DIMM). Non-limiting examples of DIMMs include a small outline DIMM (SODIMM), registered DIMM (RDIMM), unregistered DIMM (UDIMM), and load-reduction DIMM (LRDIMM). Different systems support different numbers of DIMMs and also different numbers DIMMs per memory channel (e.g., one DIMM per channel (1DPC), two DIMM per channel (2DPC), three DIMM per channel (3DPC), and so on).

A conventional compression attached memory module may include a conventional memory board with compression contact pads on one side of the memory board. The conventional module may be mounted to a main board by screws with a compression mount technology (CMT) connector providing the connection between the compression contact pads on the one side of the conventional memory board and corresponding compression contact pads on the main board. Other hardware such as top and bottom bolster plates may also be utilized in the assembly. In a laptop, tablet, or other small form factor computing device a compression attached memory module may be suitable to utilize in place of SODIMM.

A problem with some conventional compression attached memory modules is that all integrated circuits on the memory modules are placed on one side of the memory board, which increases the area of the memory module for a desired memory capacity. Another problem with some conventional compression attached memory modules is that the entire module must be removed for repairs or swapped out for upgrades. Another problem is that to support multiple DIIMs for increased memory capacity, such as for a 2DPC or 3DPC system, all of the DIMMs are implemented on the same one side of the memory board, which again limits flexibility in terms of upgrades and increases the board space needed in the X and/or Y directions. Another problem is that inventory management may be more complicated if multiple different modules are required to support different numbers of DIMMs per channel Some examples described herein overcome one or more of the foregoing problems.

With reference to FIG. 1, an example of an apparatus 10 may include a first set of compression contact pads 11 formed on a first side 12*t* (e.g., a top side) of a memory board 12, and a second set of compression contact pads 13 formed on a second side 12*b* (e.g., a bottom side) of the memory board 12 opposite to the first side 12*t* of the memory board 12. In some examples, the first set of compression contact pads 11 are respectively electrically connected to the second set of compression pads 13 (e.g., and optionally where the first set of compression contact pads 11 may be substantially aligned with the second set of compression pads 13). As illustrated in FIG. 1, the apparatus 10 may further include two or more memory devices 14 (e.g., memory dice, chiplets, etc.) disposed on one or more of the first and second sides 12*t*, 12*b* of the memory board 12.

Any suitable manufacturing techniques may be utilized to form the two sets of compression contact pads 11, 13 on both sides 12*t*, 12*b* of the memory board 12, to align the two sets of compression contact pads 11, 13, and to electrically connect the two sets of compression contact pads 11, 13 (e.g., with microvias).

As used herein, a compression contact pad may refer to a contact pad that is particularly formed for use with a CMT connector. Non-limiting example characteristics of a compression contact pad generally include signal integrity for high speed data, better routing flexibility as compared to plated through holes, and reliable solderless connections (although not all examples of a compression contact pad necessarily exhibit all of these characteristics). Press-fit mounted and other conventional connectors may provide a connection to the signal layers using plated through holes. Such plated through holes may create interference and stub effects that affect fast signal edges or high-frequency signals. In contrast, a compression contact pad may provide a connection to the signal layers using microvias.

Microvias are small openings in a circuit board that are plated with conductive materials (e.g., such as copper) on the inside and also have a conductive plate on the top. In some implementations, microvias may have a conical frustum shape where the microvias slope inwards as they make a layer transition and terminate at a pad in the next layer. In some implementations, microvias may only span a single layer for better reliability. In some implementations, stacked microvias may be utilized to form connections across multiple layers. Microvias may reduce or eliminate the need for large plated through holes, which may result in significantly less interference and may provide other characteristics that are well-suited for high speed data. The small size of the compression contact pads also provides routing flexibility because the smaller area of the microvias provides more space for routing tracks. While small relative to plated through holes, the compression contact pads are still large enough to provide a reliable connection with the pins/springs of a CMT connector.

Some examples of the apparatus 10 may be implemented as stackable memory module with double-sided compression contact pads (e.g., where one or more microvias connect the first set of compression contact pads 11 on the first side 12*t* to the second set of compression contact pads 13 on the second side 12*b*). A CMT connector may be utilized between each of the stacked boards/modules in an electronic assembly. In some examples, the apparatus 10 may further include circuitry 15 to configure the two or more memory devices 14 to operate as a memory module of a one module per channel configuration. For example, the one module per channel configuration may corresponds to a 1DPC configuration. In another example, the circuitry 15 may be further to configure the two or more memory devices 14 to operate as one memory module of a multiple module per channel configuration. For example, the multiple module per channel configuration may correspond to a 2DPC configuration, a 3DPC configuration, and so on.

Examples of the circuitry 15 may be included as part of a general purpose controller, a special purpose controller, a memory controller, a storage controller, a micro-controller, an execution unit, etc. In some examples, the two or more memory devices 14, the circuitry 15, and/or other system memory may be located in, or co-located with, various components, including a processor (e.g., on a same die or package substrate). Examples of a suitable controller, memory devices 14, circuitry 15, and other apparatus components may be implemented in hardware, software, or any suitable combination thereof. For example, hardware implementations may include configurable logic, fixed-functionality logic, or any combination thereof. Examples of configurable logic include suitably configured programmable logic arrays (PLAs), FPGAs, complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

For example, the circuitry 15 may be implemented on a semiconductor apparatus, which may include one or more substrates, with the circuitry 15 coupled to the one or more substrates. In some examples, the circuitry 15 may be at least partly implemented in one or more of configurable logic and fixed-functionality hardware logic on semiconductor substrate(s) (e.g., silicon, sapphire, gallium-arsenide, etc.). For example, the circuitry 15 may include a transistor array and/or other integrated circuit components coupled to the substrate(s) with transistor channel regions that are positioned within the substrate(s). The interface between the circuitry 16 and the substrate(s) may not be an abrupt junction. The circuitry 15 may also be considered to include an epitaxial layer that is grown on an initial wafer of the substrate(s).

Alternatively, or additionally, all or portions of these components may be implemented in one or more modules as a set of logic instructions stored in a machine- or computer-readable storage medium such as RAM, ROM, programmable ROM (PROM), firmware, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the memory device 12, NVM, other persistent storage media, or other system memory may store a set of instructions (e.g., which may be firmware instructions) which when executed by a controller cause the apparatus 10 to implement one or more components, features, or aspects of the apparatus 10 (e.g., operating in a 1DPC configuration, operating in a 2DPC configuration, etc.).

Figure 2A:
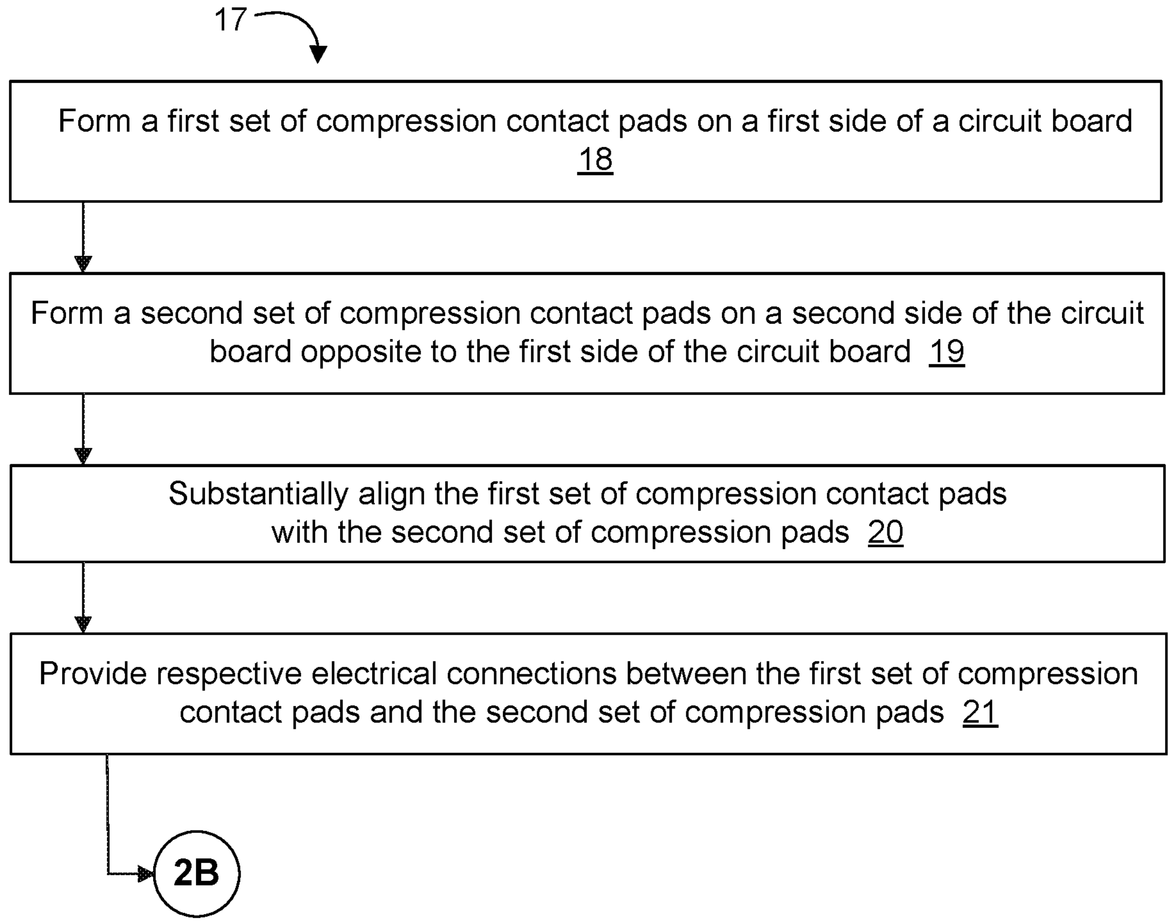
FIGS. 2A to 2B are illustrative diagrams of an example of a method according to an example.
Figure 2B:
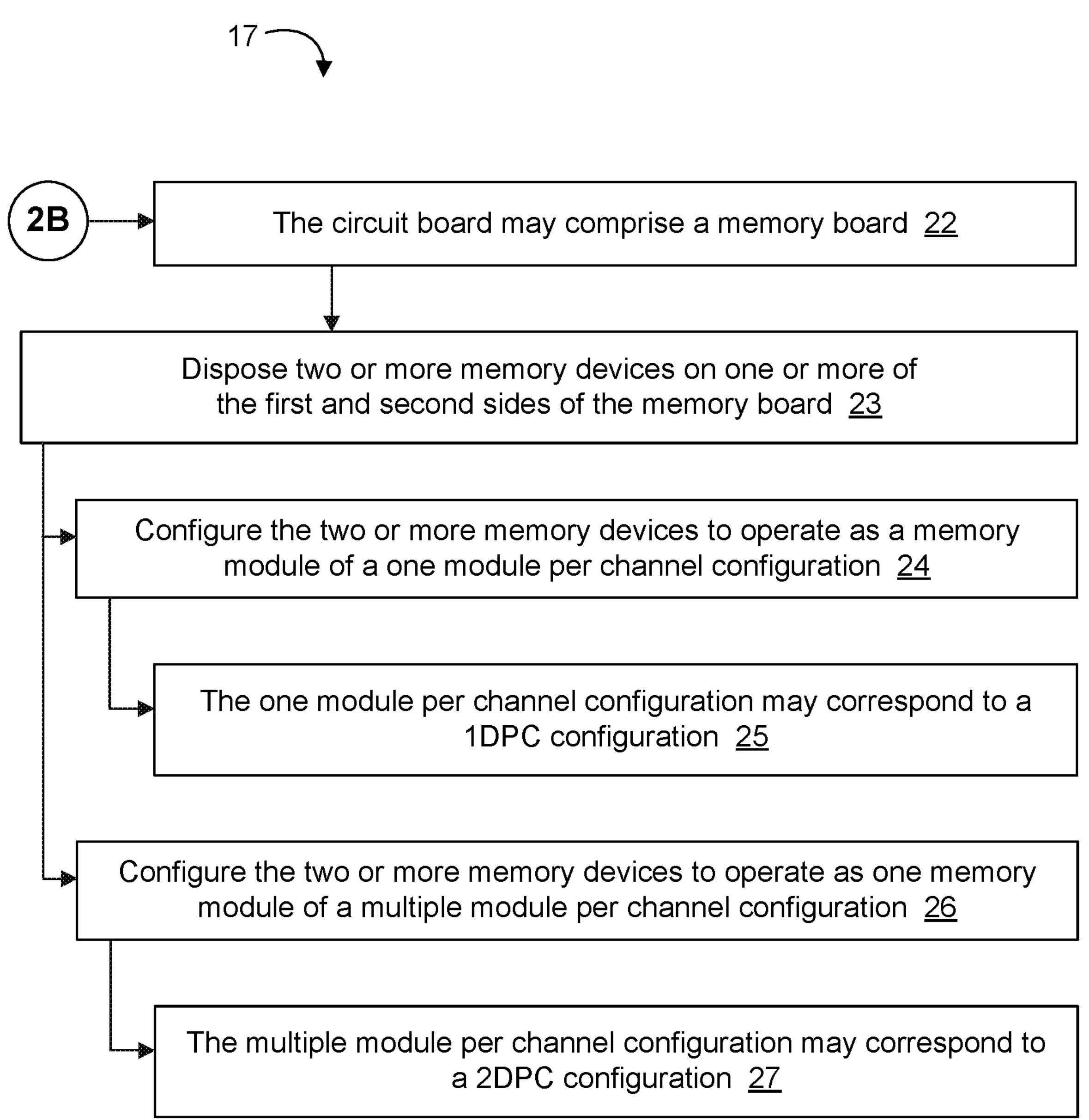

With reference to FIGS. 2A to 2B, an example of a method 17 (e.g., of manufacturing a memory module) may include forming a first set of compression contact pads on a first side of a circuit board (e.g., a memory board) at box 18, forming a second set of compression contact pads on a second side of the circuit board opposite to the first side of the circuit board at box 19, optionally substantially aligning the first set of compression contact pads with the second set of compression pads at box 20, and providing respective electrical connections between the first set of compression contact pads and the second set of compression pads at box 21 (e.g., with microvias). For example, the circuit board may comprise a memory board at box 22, and the method 17 may further include disposing two or more memory devices on one or more of the first and second sides of the memory board at box 23.

Some examples of the method 17 may further include configuring the two or more memory devices to operate as a memory module of a one module per channel configuration at box 24. For example, the one module per channel configuration may correspond to a 1DPC configuration at box 25. Some examples of the method 17 may further include configuring the two or more memory devices to operate as one memory module of a multiple module per channel configuration at box 26. For example, the multiple module per channel configuration may correspond to a 2DPC configuration at box 27. Any suitable manufacturing/programming techniques may be utilized to perform the method 17.

Figure 3:
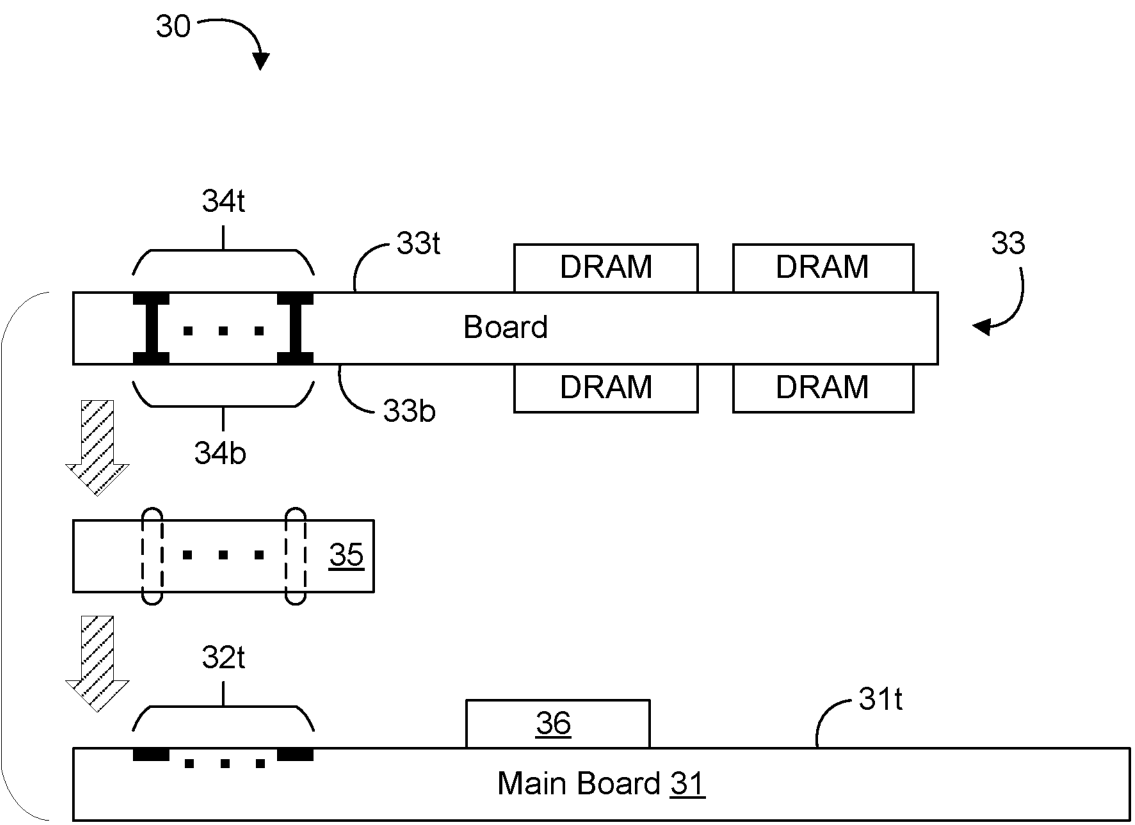
FIG. 3 is an exploded illustrative diagram of a system according to an example.

With reference to FIG. 3, an example of a system 30 may include a main board 31 having first compression contact pads 32*t* formed on a first side 31*t* of the main board 31, a first memory module 33 having second and third electrically connected compression contact pads 34*b*, 34*t* formed on two opposed sides 33*b*, 33*t* of the first memory module 33, and a first compression mount connector 35 compressed between the main board 31 and the first memory module 33 to communicatively couple the first compression contact pads 32*t* of the main board 31 and the second and third compression contact pads 34*b*, 34*t* of the first memory module 33. For example, the first compression contact pads 32*t* may be connected to the second compression contact pads 34*b* through the connector 35 and then connected to the third compression contact pads 34*t* through electrical connections (e.g., microvias) within the first memory module 33. In some examples, the system 30 may further include circuitry 36 to configure the first memory module 33 as a memory module of a one module per channel configuration (e.g., where the one module per channel configuration may correspond to a 1DPC configuration). Although shown on the main board 31, all or parts of the circuitry 36 may be implemented on the stacked memory module(s).

Figure 4:
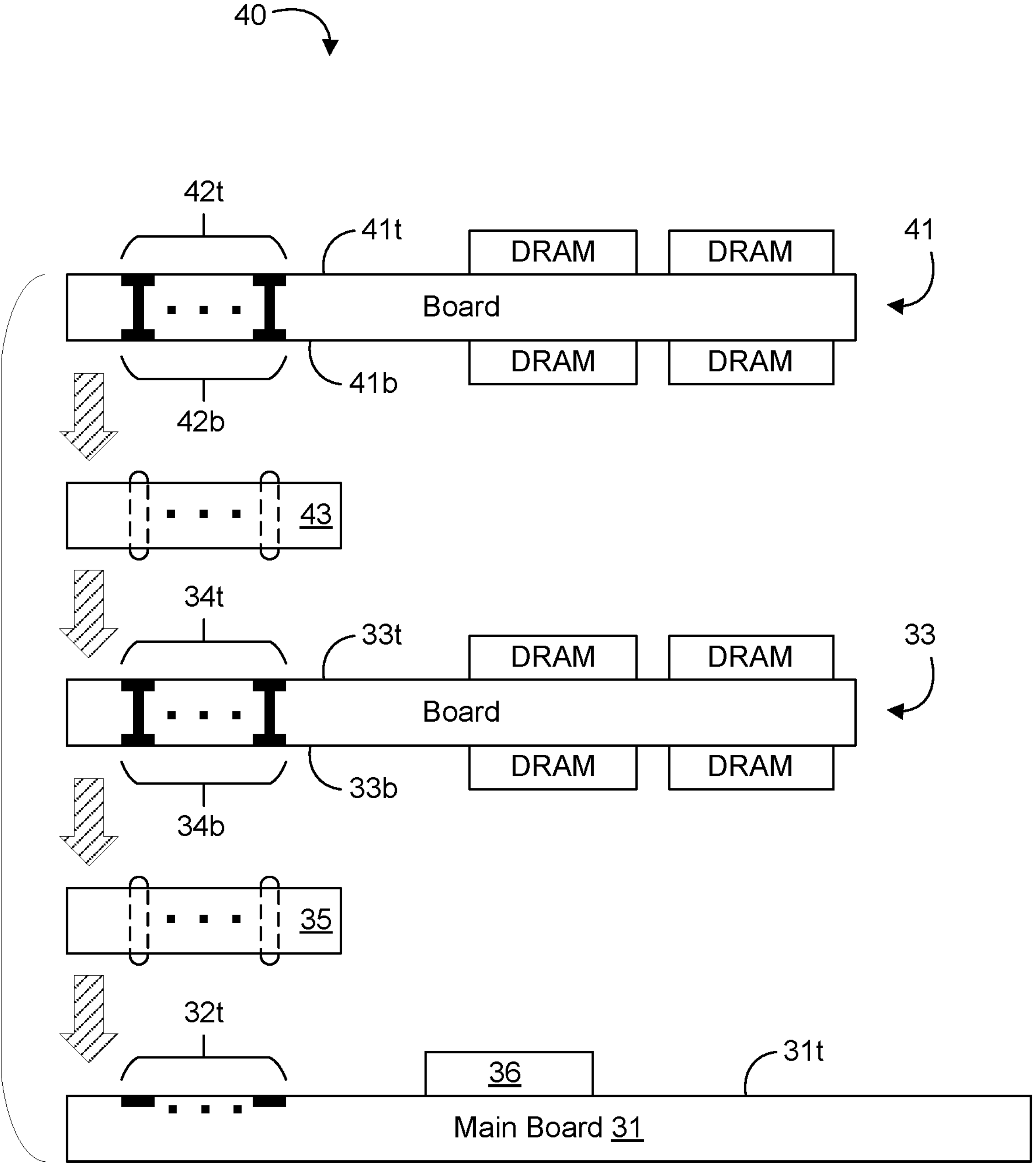
FIG. 4 is an exploded illustrative diagram of another system according to an example.

With reference to FIG. 4, an example of a system 40 may include similar components from the system 30 (identified with like reference numerals). The system 40 may further include a second memory module 41 having fourth compression contact pads 42*b* formed on a first side 41*b* of the second memory module 41, and a second compression mount connector 43 compressed between the first memory module 33 and the second memory module 41 to communicatively couple the fourth compression contact pads 42*b* of the second memory module 47 and the second and third compression contact pads 34*b*, 34*t* of the first memory module 33. In some examples, the second memory module 41 further comprises fifth compression contact pads 42*t* formed on a second side 41*t* of the second memory module 41 opposed to the first side 41*b* of the second memory module 41. For example, the fourth compression contact pads 42*b* may be connected to the third compression contact pads 34*t* through the connector 43 and then connected to the second compression contact pads 34*b* through electrical connections (e.g., microvias) within the first memory module 33. The fifth compression contact pads 42*t* may be connected to the fourth compression contact pads 42*b* through electrical connections (e.g., microvias) within the second memory module 41.

In some examples, the circuitry 36 may be further to configure the first and second memory modules 33, 41 as respective memory modules of a multiple module per channel configuration (e.g., where the multiple module per channel configuration corresponds to a 2DPC configuration). In some implementations, the first memory module 33 may be substantially identical to the second memory module 41 (e.g., and further additional stackable memory modules) and only a configuration change by the circuitry 36 is needed for the system 40 to operate as a 1DPC configuration, a 2DPC configuration, etc., depending on how many memory modules are stacked on the main board 31. For example, each of the modules 33, 41, etc., may be implemented as a stackable memory module with double-sided compression contact pads (e.g., where one or more microvias connect the compression contact pads on each side of the module). A CMT connector may be utilized between each of the stacked boards/modules in the system 40.

Figure 5:
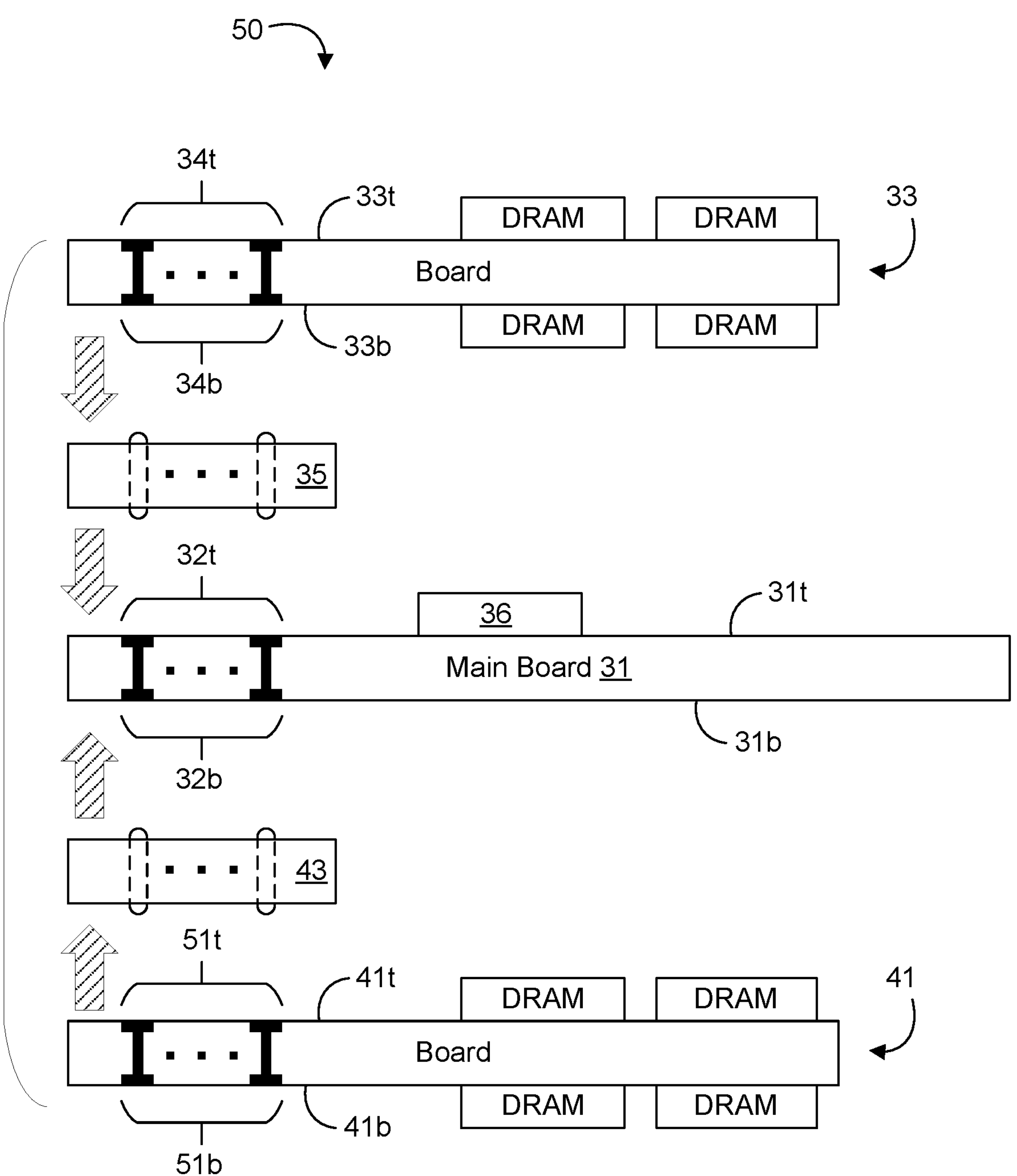
FIG. 5 is an exploded illustrative diagram of another system according to an example.

With reference to FIG. 5, an example of a system 50 may include similar components from the systems 30 and 40 (identified with like reference numerals). In the example system 50, the main board 31 may include sixth compression contact pads 32*b* formed on a second side 31*b* of the main board 31 opposed to the first side 31*t* of the main board 31. In this example, fourth compression contact pads 51*t* may be formed on the second side 41*t* of the second memory module 41, and the second compression mount connector 43 may be compressed between the main board 31 and the second memory module 41 to communicatively couple the fourth compression contact pads 51*t* of the second memory module and the sixth compression contact pads 32*b* of the main board 31. In some examples, the second memory module 41 further comprises fifth compression contact pads 51*b* formed on the first side 41*b* of the second memory module 41 opposed to the second side 41*t* of the second memory module 41. The circuitry 36 may still be configured to set up the first and second memory modules 33, 41 as respective memory modules of a multiple module per channel configuration (e.g., a 2DPC configuration).

Figure 6B:
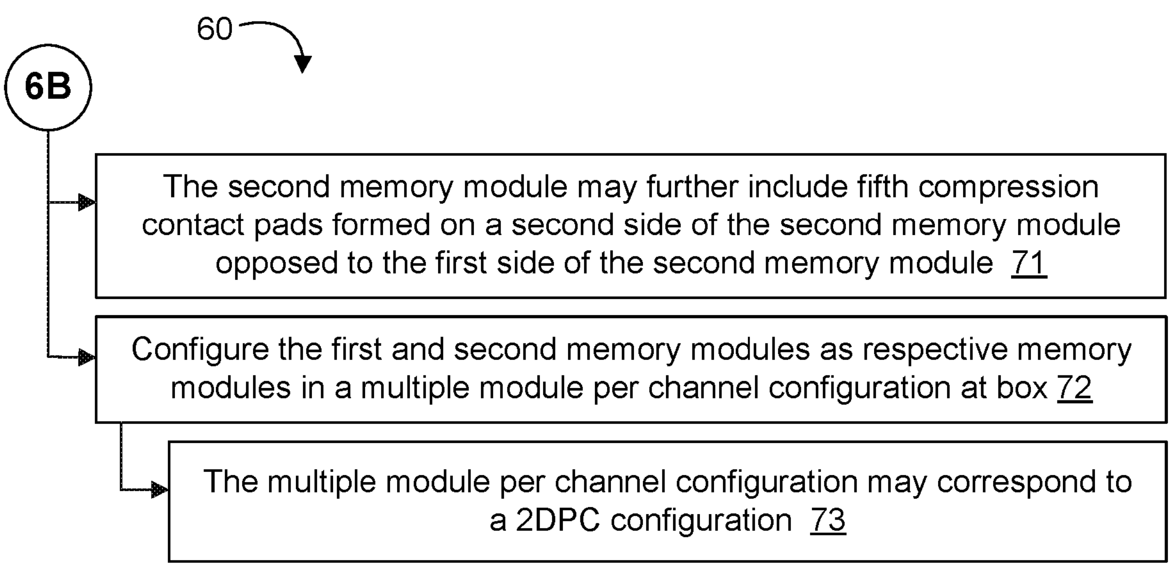

With reference to FIGS. 6A and 6B, an example of a method 60 (e.g., of assembling an electronic system) may include providing a main board having first compression contact pads formed on a first side of the main board at box 61, providing a first memory module having second and third electrically connected compression contact pads formed on two opposed sides of the first memory module at box 62, and compressing a first compression mount connector between the main board and the first memory module to communicatively couple the first compression contact pads of the main board and the second and third compression contact pads of the first memory module at box 63. The method 60 may further include configuring the first memory module as a memory module of a one module per channel configuration at box 64 (e.g., where the one module per channel configuration may correspond to a 1DPC configuration at box 65).

Some examples of the method 60 may further include providing a second memory module having fourth compression contact pads formed on a first side of the second memory module at box 66, and compressing a second compression mount connector between the first memory module and the second memory module to communicatively couple the fourth compression contact pads of the second memory module and the second and third compression contact pads of the first memory module at box 67. Alternatively, in other examples of the method 60, the main board may include sixth compression contact pads formed on a second side of the main board opposed to the first side of the main board at box 68, and the method 60 may further include providing a second memory module having fourth compression contact pads formed on a first side of the second memory module at box 69, and compressing a second compression mount connector between the main board and the second memory module to communicatively couple the fourth compression contact pads of the second memory module and the sixth compression contact pads of the main board at box 70.

For either of the foregoing examples, the second memory module may further include fifth compression contact pads formed on a second side of the second memory module opposed to the first side of the second memory module at box 71, and/or the method 60 may further include configuring the first and second memory modules as respective memory modules in a multiple module per channel configuration at box 72 (e.g., where the multiple module per channel configuration corresponds to a 2DPC configuration at box 73).

Figure 7:
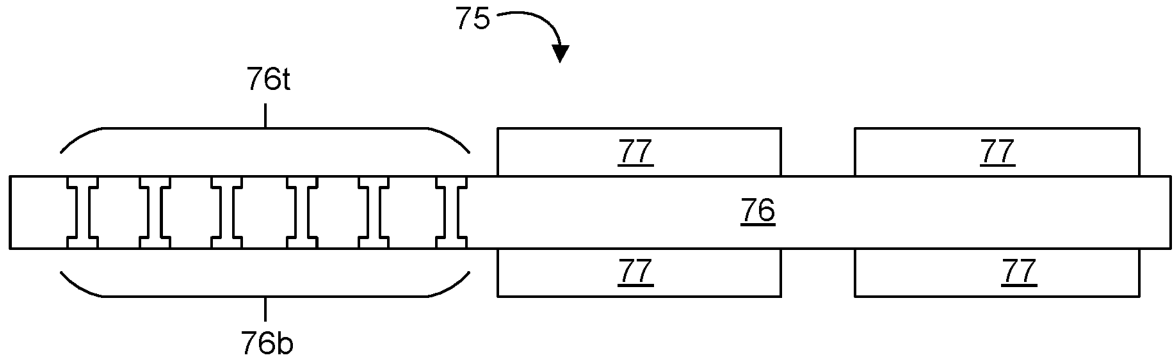
FIG. 7 is an illustrative diagram of a stackable memory module according to an example.

FIG. 7 shows an example of a stackable memory module 75. The module 75 includes a circuit board (e.g., a PCB) 76 with memory devices 77 surface mounted to both sides of the board 76. The stackable memory module 75 also has CMT contact pads on both sides. For example, the board 76 may be fabricated with compression contact pads 76*t* on a top side of the board 76 electrically connected through the board 76 to compression contact pads 76*b* on a bottom side 76*b* of the board (e.g., connected by microvias). By including the compression contacts pads 76*t*, 76*b* on both sides of the board 76, the module 75 provides a stackable memory module with double-sided compression contact pads. Advantageously, the module 75 may be utilized in a wide variety of electronic assemblies.

Figure 8:
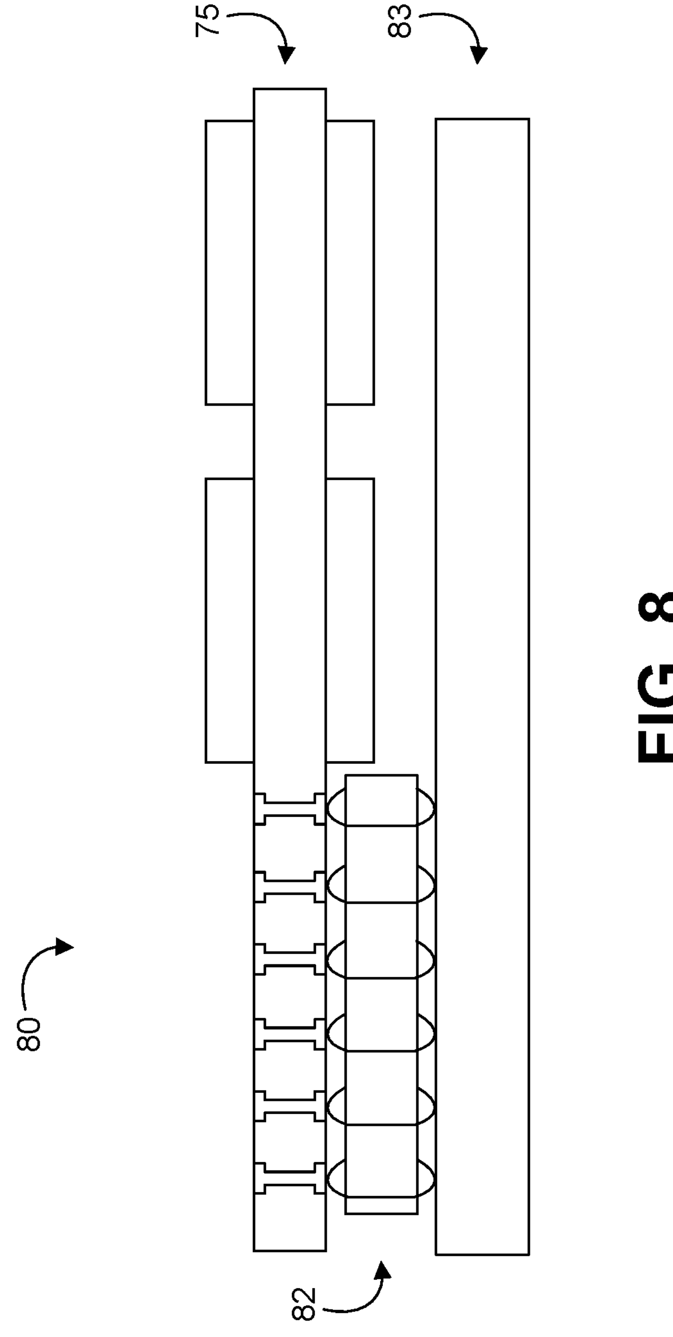
FIG. 8 is an illustrative diagram of an electronic assembly according to an example.

FIG. 8 shows an example of an electronic assembly 80 that includes a stacked arrangement of the stackable memory module 75, a CMT connector 82 and a main board 83. The assembly 80 may further include other components and/or hardware such as a power supply, bolster plates, insulating material, fasteners, clamps, a housing, etc. (not illustrated so as to not unnecessarily obscure the figure). The illustrated example may provide a suitable arrangement for a one memory module per channel (e.g., a 1DPC) configuration.

Figure 9:
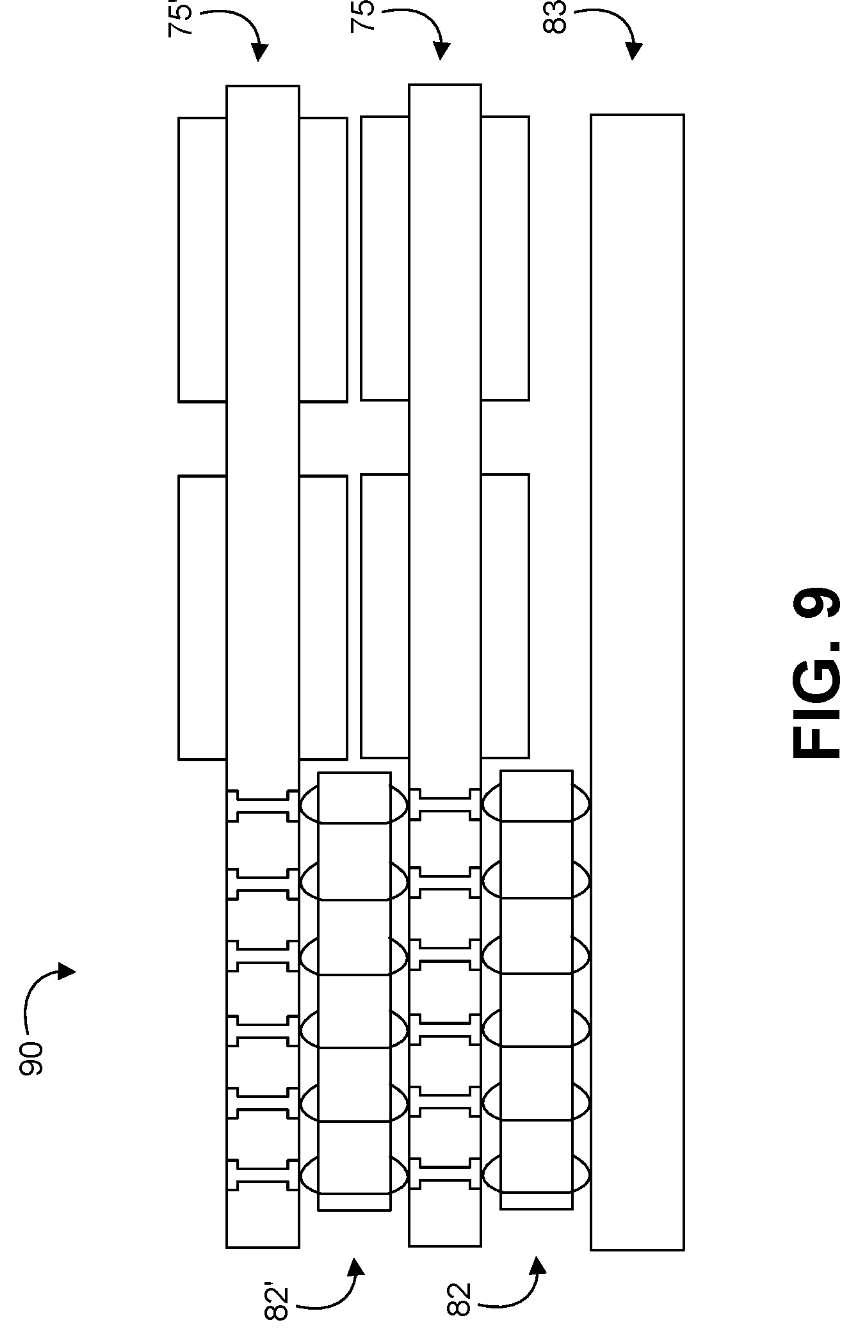
FIG. 9 is an illustrative diagram of another electronic assembly according to an example.

Some examples provide technology for a two memory module per channel (e.g., a 2DPC) configuration using a CMT connector. FIG. 9 shows another example of an electronic assembly 90 that includes a stacked arrangement of two stackable memory modules 75 and 75', two CMT connector 82 and 82', and the main board 83. For example, the second CMT connector 82' may be utilized to add the second memory module 75' to the assembly 80 to increase the memory capacity, without any change of the first memory module 75. To support 2DPC, the second CMT connector 82' is placed above the first memory module 75 (e.g., DIMM_0). The second memory module 75' (e.g., DIMM_2) is connected to the first memory module 75 through the second CMT connector 82'.

Advantageously, in some examples the same memory module may be used to support both 1DPC and 2DPC configuration. Another advantage in some implementations is that the stackable arrangement involves less X and Y spacing (e.g., less board area for the modules). Another advantage is that some implementations more provide more flexibility for different memory capacities and upgrades.

Figure 10:
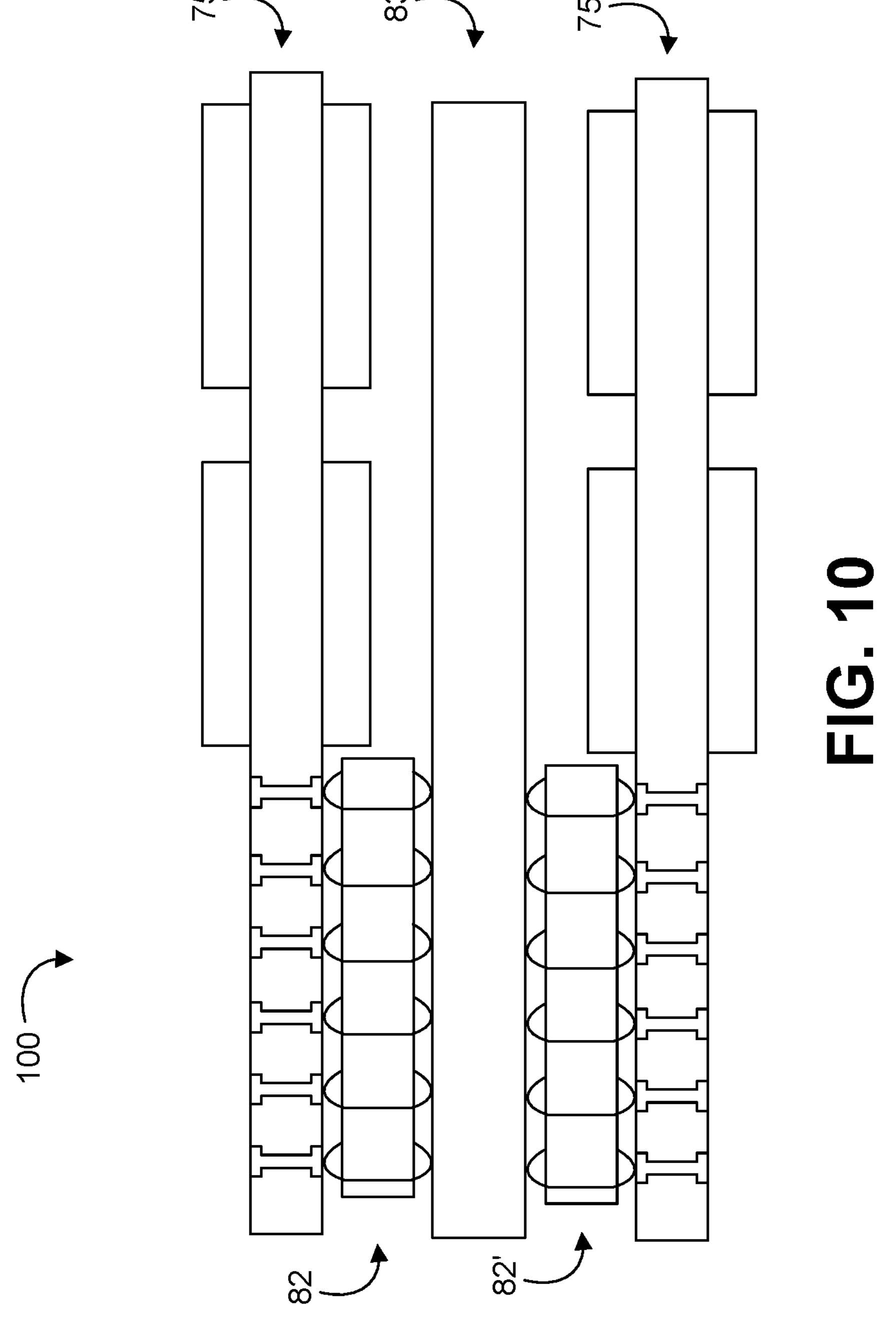
FIG. 10 is an illustrative diagram of another electronic assembly according to an example.
Figure 11:
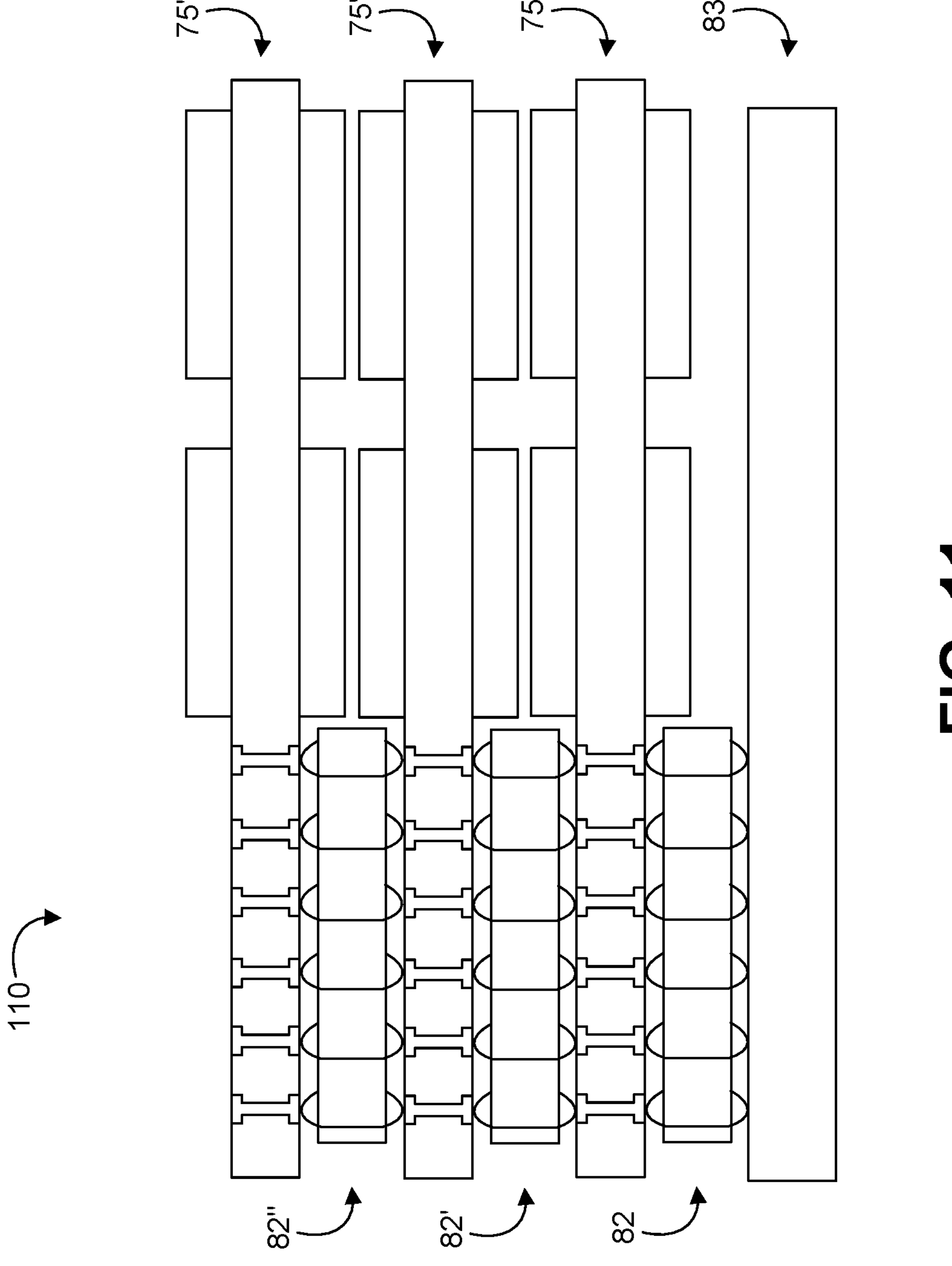
FIG. 11 is an illustrative diagram of another electronic assembly according to an example.
Figure 12:
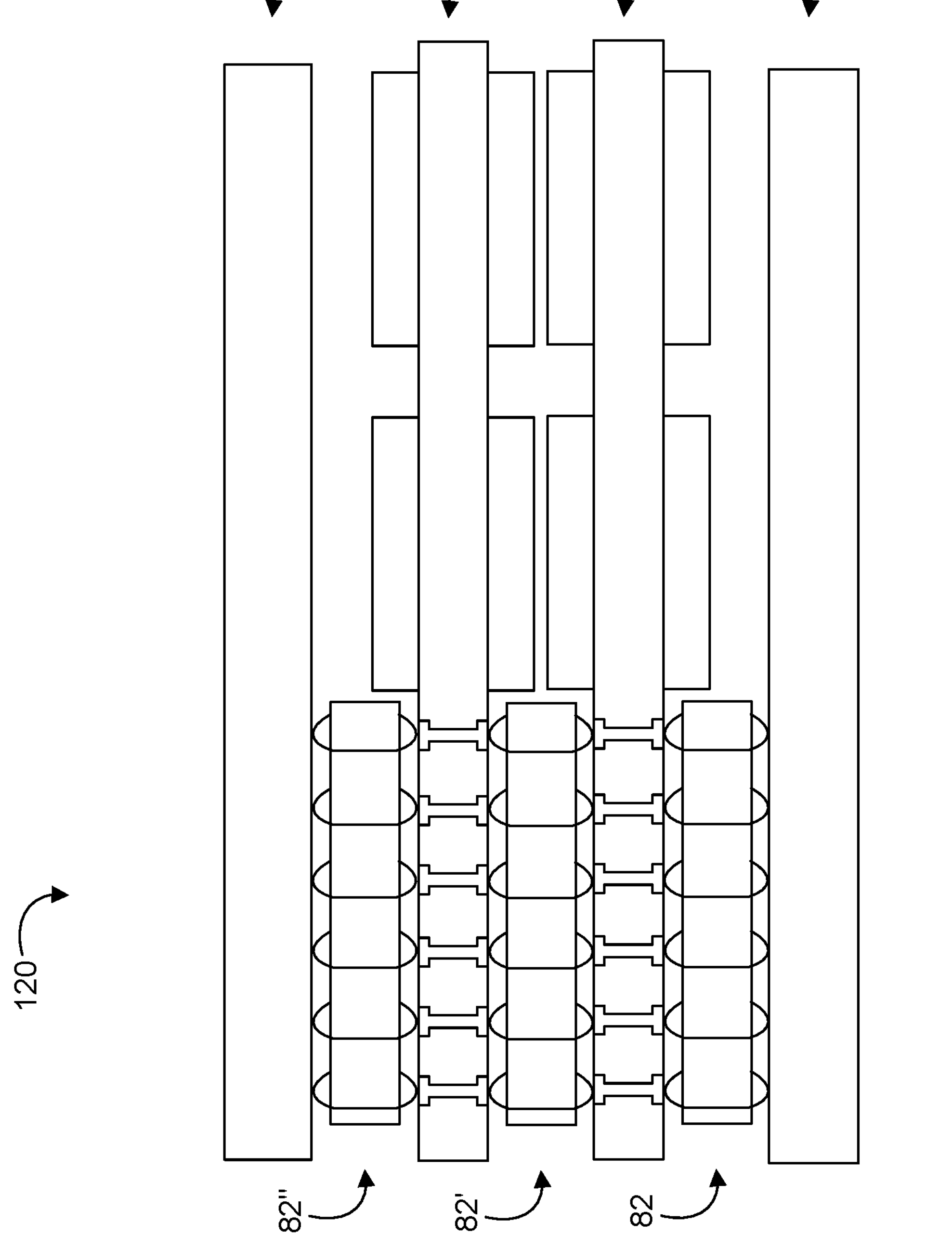
FIG. 12 is an illustrative diagram of another electronic assembly according to an example.

FIG. 10 shows another example of an electronic assembly 100 that includes a stacked arrangement with the main board 83 between the two stackable memory modules 75 and 75'. FIG. 11 shows another example of an electronic assembly 110 that includes a stacked arrangement of three stackable memory modules 75, 75', and 75", three CMT connector 82, 82', and 82", and the main board 83. FIG. 12 shows another example of an electronic assembly 120 that includes a stacked arrangement of two stackable memory modules 75 and 75', three CMT connector 82, 82', and 82", the main board 83 and another circuit board 83'. Given the benefit of the present application, numerous other beneficial stacked arrangements will occur to those skilled in the art.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

ADDITIONAL NOTES AND EXAMPLES

Example 1 includes an apparatus, comprising a first set of compression contact pads formed on a first side of a memory board, a second set of compression contact pads formed on a second side of the memory board opposite to the first side of the memory board, wherein the first set of compression contact pads are respectively electrically connected to the second set of compression pads (e.g., and optionally wherein the first set of compression contact pads are substantially aligned with the second set of compression pads).

Example 2 includes the apparatus of Example 1, further comprising two or more memory devices disposed on one or more of the first and second sides of the memory board.

Example 3 includes the apparatus of Example 2, further comprising circuitry to configure the two or more memory devices to operate as a memory module of a one module per channel configuration.

Example 4 includes the apparatus of Example 3, wherein the one module per channel configuration corresponds to a one dual-inline memory module per channel configuration.

Example 5 includes the apparatus of any of Examples 2 to 4, further comprising circuitry to configure the two or more memory devices to operate as one memory module of a multiple module per channel configuration.

Example 6 includes the apparatus of Example 5, wherein the multiple module per channel configuration corresponds to a two dual-inline memory module per channel configuration.

Example 7 includes a method, comprising forming a first set of compression contact pads on a first side of a memory board, forming a second set of compression contact pads on a second side of the memory board opposite to the first side of the memory board, optionally substantially aligning the first set of compression contact pads with the second set of compression pads, and providing respective electrical connections between the first set of compression contact pads and the second set of compression pads.

Example 8 includes the method of Example 7, further comprising disposing two or more memory devices on one or more of the first and second sides of the memory board.

Example 9 includes the method of Example 8, further comprising configuring the two or more memory devices to operate as a memory module of a one module per channel configuration.

Example 10 includes the method of Example 9, wherein the one module per channel configuration corresponds to a one dual-inline memory module per channel configuration.

Example 11 includes the method of any of Examples 8 to 10, further comprising configuring the two or more memory devices to operate as one memory module of a multiple module per channel configuration.

Example 12 includes the method of Example 11, wherein the multiple module per channel configuration corresponds to a two dual-inline memory module per channel configuration.

Example 13 includes a system, comprising a main board having first compression contact pads formed on a first side of the main board, a first memory module having second and third electrically connected compression contact pads formed on two opposed sides of the first memory module, and a first compression mount connector compressed between the main board and the first memory module to communicatively couple the first compression contact pads of the main board and the second and third compression contact pads of the first memory module.

Example 14 includes the system of Example 13, further comprising circuitry to configure the first memory module as a memory module of a one module per channel configuration.

Example 15 includes the system of Example 14, wherein the one module per channel configuration corresponds to a one dual-inline memory module per channel configuration.

Example 16 includes the system of any of Examples 13 to 15, wherein the main board includes sixth compression contact pads formed on a second side of the main board opposed to the first side of the main board, further comprising a second memory module having fourth compression contact pads formed on a first side of the second memory module, and a second compression mount connector compressed between the main board and the second memory module to communicatively couple the fourth compression contact pads of the second memory module and the sixth compression contact pads of the main board.

Example 17 includes the system of any of Examples 13 to 15, further comprising a second memory module having fourth compression contact pads formed on a first side of the second memory module, and a second compression mount connector compressed between the first memory module and the second memory module to communicatively couple the fourth compression contact pads of the second memory module and the second and third compression contact pads of the first memory module.

Example 18 includes the system of any of Examples 16 to 17, wherein a second memory module further comprises fifth compression contact pads formed on a second side of the second memory module opposed to the first side of the second memory module.

Example 19 includes the system of any of Examples 16 to 17, further comprising circuitry to configure the first and second memory modules as respective memory modules of a multiple module per channel configuration.

Example 20 includes the system of Example 18, wherein the multiple module per channel configuration corresponds to a two dual-inline memory module per channel configuration.

Example 21 includes a method, comprising providing a main board having first compression contact pads formed a first side of the main board, providing a first memory module having second and third electrically connected compression contact pads formed on two opposed sides of the first memory module, and compressing a first compression mount connector between the main board and the first memory module to communicatively couple the first compression contact pads of the main board and the second and third compression contact pads of the first memory module.

Example 22 includes the method of Example 21, further comprising configuring the first memory module as a memory module of a one module per channel configuration.

Example 23 includes the method of Example 22, wherein the one module per channel configuration corresponds to a one dual-inline memory module per channel configuration.

Example 24 includes the method of any of Examples 21 to 23, wherein the main board includes sixth compression contact pads formed on a second side of the main board opposed to the first side of the main board, further comprising providing a second memory module having fourth compression contact pads formed on a first side of the second memory module, and compressing a second compression mount connector between the main board and the second memory module to communicatively couple the fourth compression contact pads of the second memory module and the sixth compression contact pads of the main board.

Example 25 includes the method of any of Examples 21 to 23, further comprising providing a second memory module having fourth compression contact pads formed on a first side of the second memory module, and compressing a second compression mount connector between the first memory module and the second memory module to communicatively couple the fourth compression contact pads of the second memory module and the second and third compression contact pads of the first memory module.

Example 26 includes the method of any of Examples 24 to 25, wherein a second memory module further comprises fifth compression contact pads formed on a second side of the second memory module opposed to the first side of the second memory module.

Example 27 includes the method of any of Examples 24 to 25, further comprising configuring the first and second memory modules as respective memory modules in a multiple module per channel configuration.

Example 28 includes the method of Example 27, wherein the multiple module per channel configuration corresponds to a two dual-inline memory module per channel configuration.

Example 29 includes an apparatus, comprising means for forming a first set of compression contact pads on a first side of a memory board, means for forming a second set of compression contact pads on a second side of the memory board opposite to the first side of the memory board, optional means for substantially aligning the first set of compression contact pads with the second set of compression pads, and means for providing respective electrical connections between the first set of compression contact pads and the second set of compression pads.

Example 30 includes the apparatus of Example 29, further comprising means for disposing two or more memory devices on one or more of the first and second sides of the memory board.

Example 31 includes the apparatus of Example 30, further comprising means for configuring the two or more memory devices to operate as a memory module of a one module per channel configuration.

Example 32 includes the apparatus of Example 31, wherein the one module per channel configuration corresponds to a one dual-inline memory module per channel configuration.

Example 33 includes the apparatus of any of Examples 30 to 32, further comprising means for configuring the two or more memory devices to operate as one memory module of a multiple module per channel configuration.

Example 34 includes the apparatus of Example 33, wherein the multiple module per channel configuration corresponds to a two dual-inline memory module per channel configuration.

Example 35 includes an apparatus, comprising means for providing a main board having first compression contact pads formed a first side of the main board, means for providing a first memory module having second and third electrically connected compression contact pads formed on two opposed sides of the first memory module, and means for compressing a first compression mount connector between the main board and the first memory module to communicatively couple the first compression contact pads of the main board and the second and third compression contact pads of the first memory module.

Example 36 includes the apparatus of Example 35, further comprising means for configuring the first memory module as a memory module of a one module per channel configuration.

Example 37 includes the apparatus of Example 36, wherein the one module per channel configuration corresponds to a one dual-inline memory module per channel configuration.

Example 38 includes the apparatus of any of Examples 35 to 37, wherein the main board includes sixth compression contact pads formed on a second side of the main board opposed to the first side of the main board, further comprising means for providing a second memory module having fourth compression contact pads formed on a first side of the second memory module, and means for compressing a second compression mount connector between the main board and the second memory module to communicatively couple the fourth compression contact pads of the second memory module and the sixth compression contact pads of the main board.

Example 39 includes the apparatus of any of Examples 35 to 37, further comprising means for providing a second memory module having fourth compression contact pads formed on a first side of the second memory module, and means for compressing a second compression mount connector between the first memory module and the second memory module to communicatively couple the fourth compression contact pads of the second memory module and the second and third compression contact pads of the first memory module.

Example 40 includes the apparatus of any of Examples 38 to 39, wherein a second memory module further comprises fifth compression contact pads formed on a second side of the second memory module opposed to the first side of the second memory module.

Example 41 includes the apparatus of any of Examples 38 to 39, further comprising means for configuring the first and second memory modules as respective memory modules in a multiple module per channel configuration.

Example 42 includes the apparatus of Example 41, wherein the multiple module per channel configuration corresponds to a two dual-inline memory module per channel configuration.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various examples may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one example may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the examples are not limited to the examples so described, but can be practiced with modification and alteration without departing from the scope of the appended claims. For example, the above examples may include specific combination of features. However, the above examples are not limited in this regard and, in various implementations, the above examples may include the undertaking only a subset of such features, undertaking a different order of such features, undertaking a different combination of such features, and/or undertaking additional features than those features explicitly listed. The scope of the examples should, therefore, be determined with reference to the appended claims, along with the full scope of equivalents to which such claims are entitled.

What is claimed is:

1. An apparatus, comprising:

a memory board comprising:

a first plurality of compression contact pads at a first side of the memory board; and a second plurality of compression contact pads at a second side of the memory board, the second side opposite to the first side, wherein the first plurality of compression contact pads are each electrically coupled, through the memory board, to a different respective compression contact pad of the second plurality of compression contact pads, wherein multiple microvias of the memory board are electrically coupled to each other in a stacked arrangement between one of the first plurality of compression contact pads and one of the second plurality of compression contact pads; and two or more memory devices each coupled to the memory board independent of both the first plurality of compression contact pads and the second plurality of compression contact pads, wherein the two or more memory devices each adjoin a respective one of the first side or the second side, and wherein the two or more memory devices are further electrically coupled to the first plurality of compression contact pads.

2. The apparatus of claim 1, further comprising:

circuitry coupled to the two or more memory devices, the circuitry to configure the two or more memory devices to operate as a memory module.

3. The apparatus of claim 2, wherein the circuitry to configure the two or more memory devices to operate as the memory module comprises the circuitry is to provide any of multiple configurations of the two or more memory devices, the multiple configurations comprising:

a one memory module per channel configuration; and a multiple memory modules per channel configuration.

4. The apparatus of claim 3, wherein the one memory module per channel configuration corresponds to a one dual-inline memory module per channel configuration.

5. The apparatus of claim 3, wherein the multiple memory modules per channel configuration corresponds to a two dual-inline memory modules per channel configuration.

6. A method, comprising:

forming a first plurality of compression contact pads on a first side of a memory board;

forming a second plurality of compression contact pads on a second side of the memory board, wherein the second side is opposite to the first side; and electrically coupling the first plurality of compression contact pads, through the memory board, each to a different respective compression contact pad of the second plurality of compression contact pads, the electrically coupling comprising:

forming multiple microvias which are electrically coupled to each other in a stacked arrangement between one of the first plurality of compression contact pads and one of the second plurality of compression contact pads; and coupling two or more memory devices each to the memory board independent of both the first plurality of compression contact pads and the second plurality of compression contact pads, wherein the two or more memory devices each adjoin a respective one of the first side or the second side.

7. The method of claim 6, further comprising:

coupling circuitry to the memory board, wherein the circuitry is to configure the two or more memory devices to operate as a memory module.

8. The method of claim 7, wherein the circuitry to configure the two or more memory devices to operate as the memory module comprises the circuitry is to provide any of multiple configurations of the two or more memory devices, the multiple configurations comprising:

a one memory module per channel configuration; and a multiple memory modules per channel configuration.

9. The method of claim 8, wherein the one memory module per channel configuration corresponds to a one dual-inline memory module per channel configuration.

10. The method of claim 8, wherein the multiple memory modules per channel configuration corresponds to a two dual-inline memory modules per channel configuration.

11. A system, comprising:

a main board comprising a first plurality of compression contact pads at a first side of the main board;

a first memory module comprising:

a memory board comprising:

a second plurality of compression contact pads at a second side of the memory board; and a third plurality of compression contact pads at a third side of the memory board, the third side opposite to the second side, wherein the second plurality of compression contact pads are each electrically coupled, through the memory board, to a different respective compression contact pad of the third plurality of compression contact pads, and wherein multiple microvias of the memory board are electrically coupled to each other in a stacked arrangement between one of the second plurality of compression contact pads and one of the third plurality of compression contact pads; and two or more memory devices each coupled to the memory board independent of both the second plurality of compression contact pads and the third plurality of compression contact pads, wherein the two or more memory devices each adjoin a respective one of the second side or the third side, and wherein the two or more memory devices are further electrically coupled to the first plurality of compression contact pads; and a first compression mount connector compressed between the main board and the first memory module to communicatively couple the first plurality of compression contact pads to the second plurality of compression contact pads.

12. The system of claim 11, further comprising:

circuitry to provide any of multiple configurations of the first memory module, the multiple configurations comprising:

a one memory module per channel configuration; and a multiple memory modules per channel configuration.

13. The system of claim 12, wherein the one memory module per channel configuration corresponds to a one dual-inline memory module per channel configuration.

14. The system of claim 11, wherein:

the main board further comprises a fourth plurality of compression contact pads at a fourth side of the main board, wherein the fourth side is opposite to the first side; and the system further comprises:

a second memory module comprising a fifth plurality of compression contact pads at a fifth side of the second memory module; and a second compression mount connector compressed between the main board and the second memory module to communicatively couple the fifth plurality of compression contact pads and the fourth plurality of compression contact pads.

15. The system of claim 11, further comprising:

a second memory module comprising a fourth plurality of compression contact pads at a fourth side of the second memory module; and a second compression mount connector compressed between the first memory module and the second memory module to communicatively couple the fourth plurality of compression contact pads to the third plurality of compression contact pads.

16. The system of claim 15, wherein the second memory module further comprises a fifth plurality of compression contact pads at a fifth side of the second memory module, wherein the fifth side is opposite the fourth side.

17. The system of claim 11, wherein, for each microvia of the multiple microvias, a respective plated conductor is formed on a top of the microvia.

* * * * *